United States Patent [19]

Nomura et al.

[11] 3,966,501
[45] June 29, 1976

[54] PROCESS OF PRODUCING SEMICONDUCTOR DEVICES

[75] Inventors: Kousi Nomura; Satoru Kawazu; Yoshihiko Hirose; Isao Inoue; Yoshihiko Watari; Koichi Kijima, all of Itami, Japan

[73] Assignee: Mitsubishi Denki Kabushiki Kaisha, Tokyo, Japan

[22] Filed: Mar. 14, 1974

[21] Appl. No.: 451,383

[30] Foreign Application Priority Data

Mar. 23, 1973 Japan.............................. 48-33191
Mar. 31, 1974 Japan.............................. 49-37064
May 18, 1973 Japan.............................. 48-55310

[52] U.S. Cl................................ 148/1.5; 148/187; 357/91
[51] Int. Cl.²...................................... H01L 21/265
[58] Field of Search................ 148/1.5, 187; 357/91

[56] References Cited

UNITED STATES PATENTS

| | | | |
|---|---|---|---|
| 3,575,745 | 4/1971 | Hill ................................. | 148/1.5 X |
| 3,745,070 | 7/1973 | Yada et al. ....................... | 148/1.5 |
| 3,748,187 | 7/1973 | Aubuchon et al. .................. | 148/1.5 |

OTHER PUBLICATIONS

Chang et al., "Fabrication for Junction Insulating Gate FET" IBM Tech. Discl. Bull., vol. 13, no. 9, Feb. 71, p. 2503.

*Primary Examiner*—L. Dewayne Rutledge
*Assistant Examiner*—J. M. Davis
*Attorney, Agent, or Firm*—Wenderoth, Lind & Ponack

[57] ABSTRACT

A silicon substrate is selectively implanted with ions and heated in a oxidizing atmosphere. Thus an oxide film is formed on the substrate so that portions of the film formed on regions implanted with the ions is partly embedded in the substrate. Then the film is etched until the surface of the substrate is selectively exposed. An impurity is diffused into the exposed surface portions to form base regions in the substrate after which the process as above described is repeated to form windows for emitter diffusion and electrodes. Also silicon is epitaxially grown on a silicon substrate selectively provided with $SiO_2$ films so that silicon in the form of a single crystal is grown on the exposed surface portions of the substrate while polycrystalline silicon grown on the $SiO_2$ films. The above process is repeated to convert the polycrystalline silicon to silicon dioxide for separating the silicon regions on the exposed surface portions from one another.

12 Claims, 42 Drawing Figures

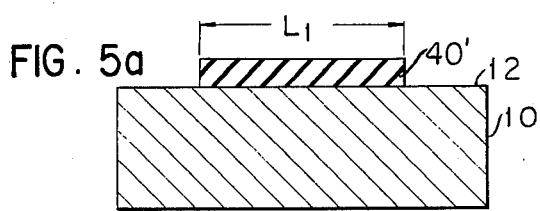
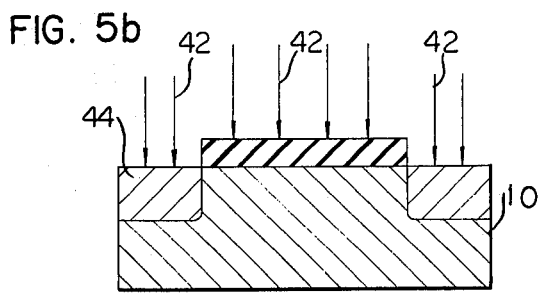
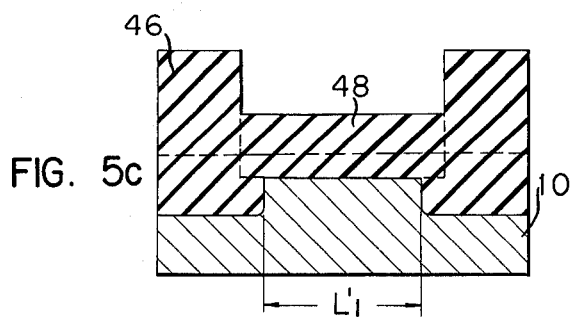
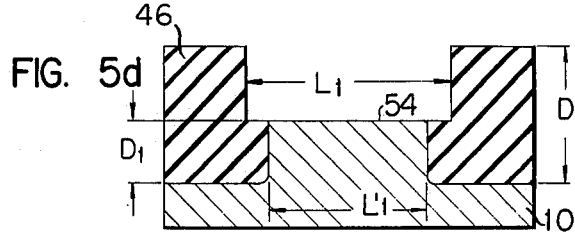
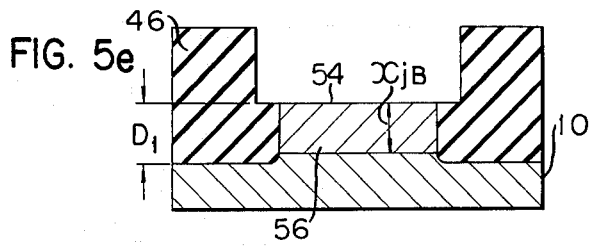
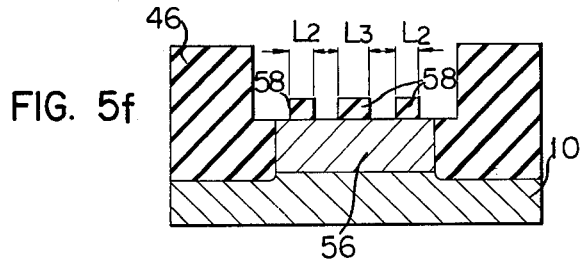
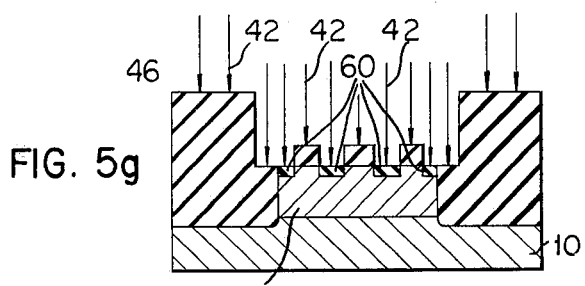
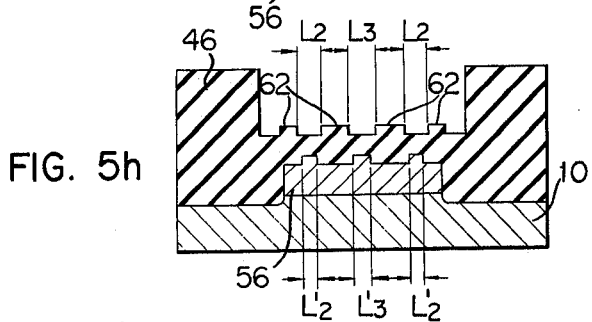
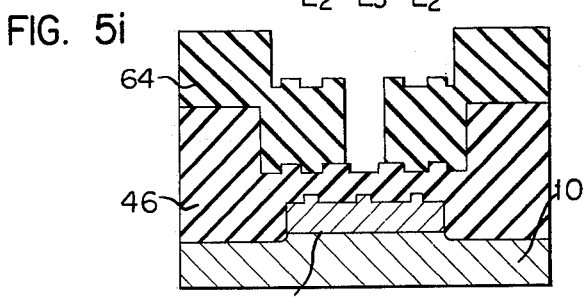
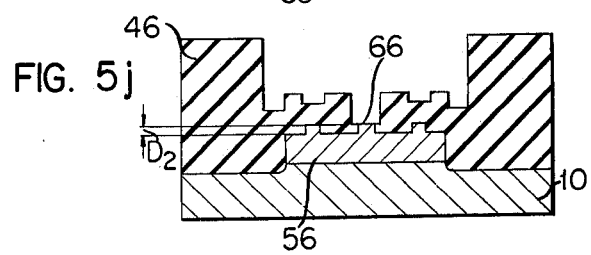
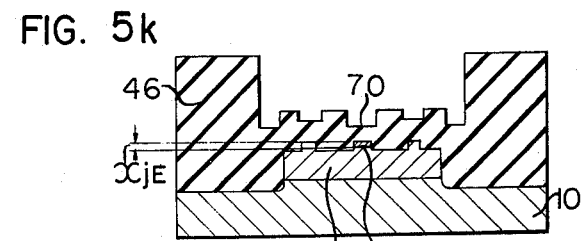
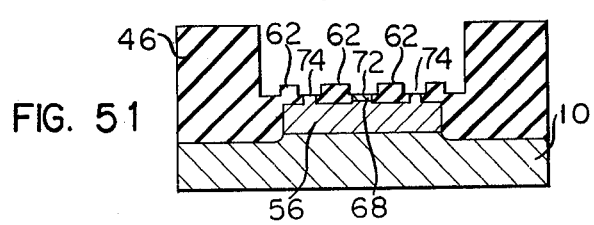

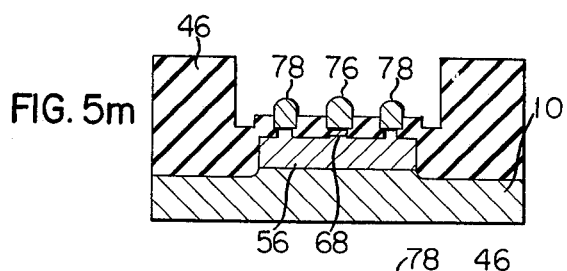
FIG. 5m
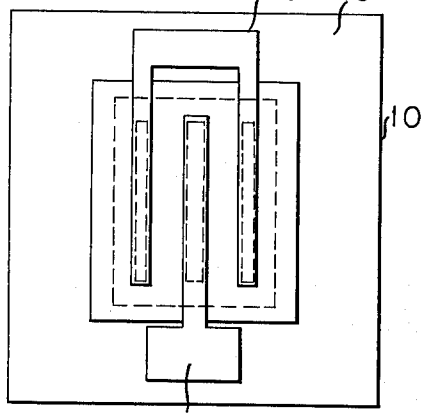
FIG. 5n
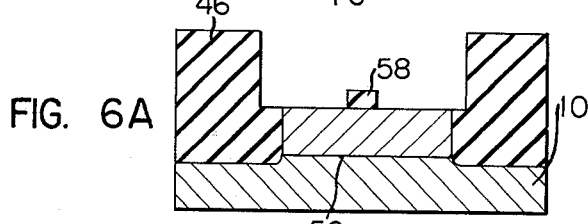
FIG. 6A
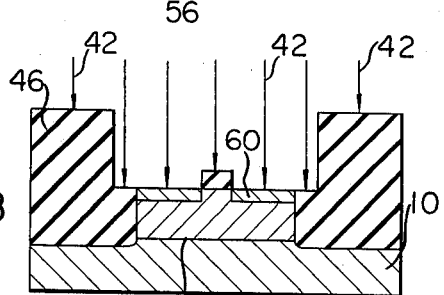
FIG. 6B
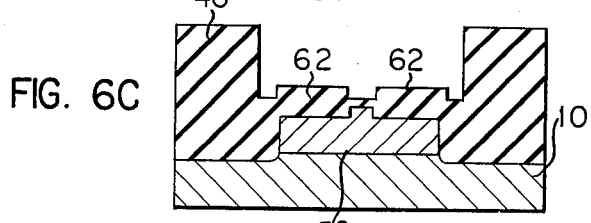
FIG. 6C
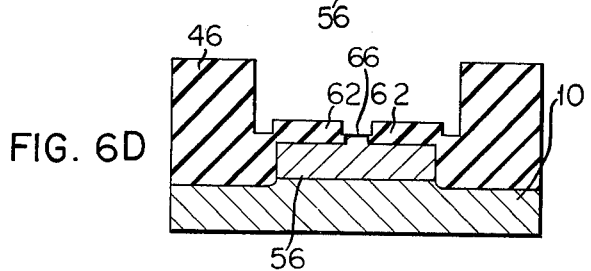
FIG. 6D
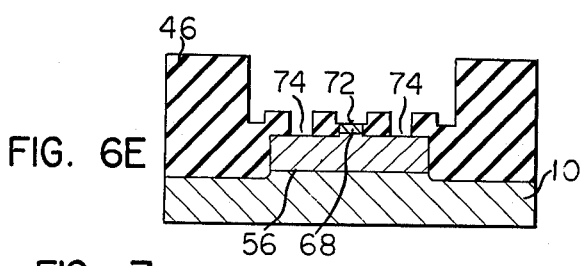
FIG. 6E
FIG. 7a
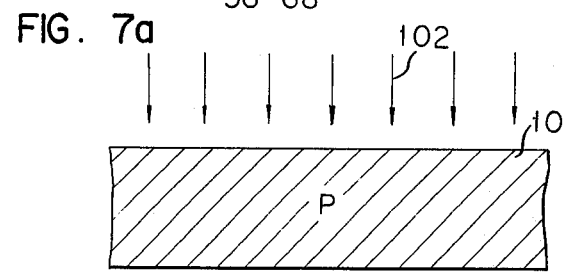
FIG. 7b
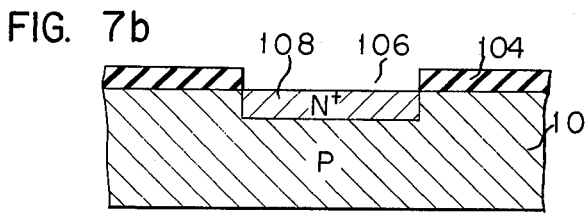
FIG. 7c
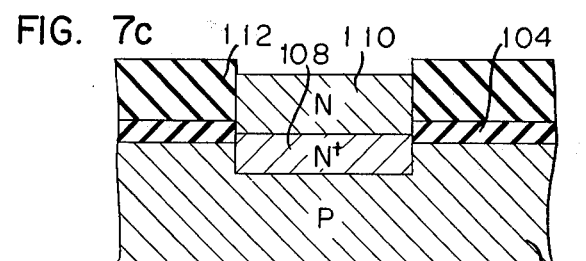
FIG. 7d
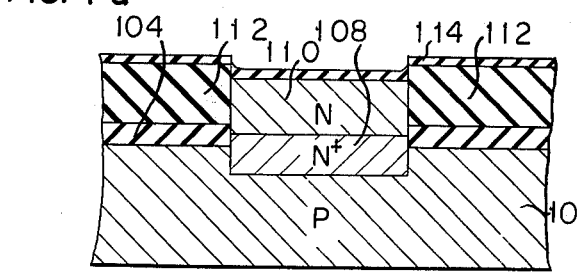
FIG. 7e
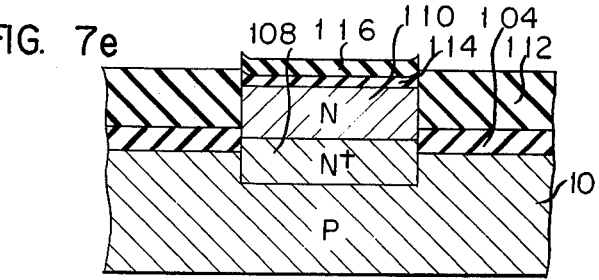

PROCESS OF PRODUCING SEMICONDUCTOR DEVICES

BACKGROUND OF THE INVENTION

This invention relates to a process of producing semiconductor devices by utilizing an ion implanting technique and more particularly to a process of producing semiconductor devices by utilizing a distinct phenomenon developed in the semiconductive material of substrates due to the implanting of accelerated ions into the substrates.

Among the existing processes of producing semiconductor devices there is one process called the PLANOX (Trade Mark) or ISOPLANAR (Trade Mark) process. That process is to selectively apply a coating of silicon nitride ($Si_3N_4$) to a surface of a semiconductor substrate and oxidize the substrate with the coating in an oxidizing atmosphere at a high temperature to selectively oxidize the surface of the substrate so that a portion of the substrate's surface having the silicon nitride coating applied thereto is not oxidized while that portion of the substrate's surface without such a coating is oxidized. The process is advantageous in that a difference in level between the surface of the substrate and the oxidized surface is small resulting in a reduction in a tendency to break an aluminum wire disposed across both surfaces later on. In the oxiding step, however, the particular oxidizing agent such as steam or oxygen can be laterally diffused into that portion of the substrate directly under the silicon nitride coating on the border of the latter to oxidize it. Thus the oxidized portion increases in volume to force up the edge of the silicon nitride coating leading to the formation of a protrusion on the oxidized surface. The protrusion is apt to break aluminum wire disposed thereacross. Also large lattice defects and high strains may occur on that portion of the substrate's surface directly contacted by the silicon nitride coating due to a difference in coefficients of thermal expansion between the silicon nitrate and the semiconductive material of the substrates. Such lattice defects and strain are undesirable from the standpoint of the characteristics of the resulting semiconductor device.

In order to reduce the lattice defects and strains as above described, it has been proposed to attempt to first apply a thin layer of silicon dioxide to a surface of a substrate formed, for example, of silicon and then dispose a silicon nitride coating upon the thin layer. In this measure oxygen or steam as an oxidizing agent involved can also be laterally diffused into that portion of the substrate directly under the edge of the nitride coating on the border of the latter to oxidize it as in the above mentioned process. Then the nitride coating and the dioxide layer are removed until the surface of the substrate is selectively exposed. During this removal of the silicon dioxide layer, that portion of the substrate initially overlaid with the nitride coating may have formed on the border a recess because the silicon has as etching rate less than silicon dioxide in dilute hydrofluoric acid commonly used in removing the silicon dioxide layer. Like the protrusion as above described, the recess is apt to break aluminum wire disposed thereacross later on.

Also the PLANOX or ISOPLANAR process can be effective for producing ultrahigh frequency semiconductor devices.

In order to improve the ultrahigh frequency operating characteristics thereof, ultrahigh frequency semiconductor devices have included a comb-shaped or mesh type emitter structure and overlay type electrodes on the oxide layer. With an increase in the operating frequency thereof, such devices tend to have a reduced width of the emitter stripe and electrode therefor while at the same time having a smaller spacing between the emitter region and the base electrodes. With a high gain required in the range of ultrahigh frequencies, an additional capacitance provided by the oxide film on the surface of the semiconductor element between each of the emitter and base electrodes and the collector electrode significantly affects the high frequency parameters because of the overlay structure thereof and may be one of the main factors of an impediment of the characteristics of the element. If the oxide film on the surface of the substrate is increased in thickness to reduce the additional capacitance then a difference in level between the film and surface becomes large which is apt to cause the breaking of aluminum wire as above described. Further the base and emitter junctions decrease in depth while the lateral diffusion along the substrate's surface decreases in length. After electrodes have been disposed on the substrate, the metal thereof reacts on the semiconductive material over a length equal to or greater than the length of lateral diffusion until the withstanding voltage is decreased. Alternatively the junctions may be broken down. In addition, the diffusion region produced by conventional processes has a curvature of diffusion with a few exceptions, for example, except for the diffusion region of mesa type semiconductor devices. An electric field established in the diffusion region is concentrated on the curved diffusion portion to limit the voltage which can be withstood by the diffusion region. Also in high frequency transistors, the distance between windows for electrodes disposed in a silicon dioxide film on the emitter and base regions greatly affects the characteristics of the transistors and is reduced as the operating frequency is displaced toward the ultrahigh frequency range. Thus a photolithographic process for forming the electrodes is required to effect the registering of masks with a high accuracy while high technical skill is necessary to adjust the etching of the silicon dioxide film. In conventional photolithographic processes, it has been possible only to describe on the silicon dioxide film a pattern with lines having a minimum width of from about 1.0 to 1.5 microns. Since ultrahigh frequency semiconductor devices have a decreased width emitter region, the ultrahigh frequency characteristics thereof are affected not only by the capacitance provided by the bottom surface of the diffusion region but also by the lateral surface thereof. This has imposed limitations upon the operation of the semiconductor devices in the range of ultrahigh frequencies.

In order that active and reactive elements disposed on a single silicon substrate be electrically insulated from one another, the PLANOX or ISOPLANAR process can be utilized to form silicon dioxide regions on the substrate between the elements. In a heat treatment for forming those silicon dioxide regions, the impurity distribution already formed in the substrate can be changed and the oxidation proceeds not only in the direction of the depth of the substrate but also in the lateral direction thereof. This gives rise to serious problems in designing and manufacturing integrated circuits and impedes the high density assembly of active and reactive elements.

SUMMARY OF THE INVENTION

Accordingly it is an object of the present invention to provide a new and improved process of producing semiconductor devices having excellent in electrical characteristics by the elimination of the disadvantages of the PLANOX or ISOPLANAR process as above described.

It is another object of the present invention to provide a new and improved process of simply producing semiconductor devices superior in characteristics to those produced by the PLANOX or ISOPLANAR process while retaining the advantages of the latter.

It is still another object of the present invention to improve the PLANOX or ISOPLANAR process to produce semiconductor devices having excellent high frequency characteristics.

It is an additional object of the present invention to provide a new and improved process of producing semiconductor devices having excellent electrical characteristics and assembled into an integrated circuit with a high density.

According to one aspect thereof, the present invention provides a process of producing semiconductor devices comprising the steps of implating accelerated charged particles into selected portions of a surface of a substrate of semiconductive material to selectively form implanted regions in the substrate and heating the substrate with the implanted regions in an oxidizing atmosphere to convert the semiconductive material of the implanted region to an oxide insulation.

The process may comprise preferably the steps of forming on selected portions of a surface of a substrate of semiconductive material coatings for blocking charged particles, irradiating the surface of the substrate with accelerated charged particles to implant the charged particles into those regions of the surface of the substrate on which the coatings are not formed, removing the coating from the surface of the substrate; heating the substrate in an oxidizing atmosphere to grow an oxide insulation upon the surface of the substrate including the regions implanted with the charged particles, and selectively removing the oxide insulation from the surface of the substrate to expose the selected portions thereof.

According to another aspect thereof concerning ultrahigh frequency semiconductor devices, the present invention provides a process of producing semiconductor devices, comprising the steps of irradiating selected portions of a surface of a substrate of semiconductive material with accelerated charged particles to selectively form regions having a fast oxidizing property on the selected surface portions, heating the substrate with the regions in an oxidizing atmosphere to form an oxide film on the selected surface portions, selectively removing the oxide film from those regions of the surface of the substrate not irradiated with the charged particles to expose those regions of the surface, and diffusing a conductivity imparting impurity into the exposed surface regions of the substrate to form junctions terminating at those portions of the oxide film embedded in the substrate.

Preferably the process may comprise the steps of diffusing a first conductivity imparting impurity into the selected portions of the surface of the substrate exposed by the preferred process as above described to form first diffusion regions in the substrate, selectively forming on the exposed surface portions of the substrate second coatings for blocking charged particles, implanting separate charged particles into those regions of the exposed surface portions of the substrate having the second coatings not formed thereon, removing the second coatings from the surface of the substrate, heating the substrate in an oxidizing atmosphere to grow second oxide insulations on the surface of the substrate including the regions implanted with the separate charged particles, selectively removing the second oxide insulations from the surface of the substrate to expose partly the surface of the substrate, and diffusing a second conductivity imparting impurity into the now exposed surface portions of the substrate to form second diffusion regions to form junctions between the first and second diffusion regions so as to encircle the ends of the junctions with those portions of the second oxide insulations embedded in the substrate.

According to still another aspect thereof concerning integrated circuits, the present invention provides a process of producing semiconductor devices, comprising the steps of selectively disposing on a surface of a substrate of semiconductive material with a first conductivity both a layer of semiconductive material with a second conductivity in the form of a single crystal and a layer of polycrystalline semiconductive material, implanting accelerated charged particles into the layer of polycrystalline semiconductive material, and heating the layer of polycrystalline semiconductive material implanted with the charged particles in an oxidizing atmosphere to convert the semiconductive material of the polycrystalline layer to an oxide insulation.

The process may comprise preferably the steps of forming a film of oxide insulation on a surface of a substrate of semiconductive material having a first conductivity, selectively removing the oxide film from the surface of the substrate to expose selected portions of the surface of the substrate, diffusing an impurity imparting a second conductivity into the exposed portions of the surface of the substrate to form diffusion regions in the substrate, epitaxially growing crystalline semiconductive material so that a layer of semiconductive material in the form of a single crystal is grown on each of the diffusion regions while a layer of polycrystalline semiconductive material is grown on the film of oxide insulation, forming coatings for blocking charged particles on the layers of semiconductive material in the form of the single crystal, irradiating the surface of the substrate with accelerated charged particles to implant the charged particles into the layer of polycrystalline semiconductive material, heating the layer of polycrystalline semiconductive material implanted with the charged particles to convert the semiconductive material of the polycrystalline layer to an oxide insulation.

In the processes above described, the coating for blocking the charged particle may be advantageously formed of a film selected from the group consisting of a silicon nitride film, a silicon dioxide film, an aluminum oxide film, an aluminum film, a molybdenum film, a tungsten film, and mixtures thereof.

Also the substrate may be formed of silicon in the form of a single crystal and the charged particles are formed of ions of an element selected from the group consisting of indium, gallium, antimony, tin and arsenic.

BRIEF DESCRIPTION OF THE DRAWINGS

The present invention will become more readily apparent from the following detailed description taken in conjunction with the accompanying drawings in which:

FIGS. 5a through 5m are fragmental longitudinal sectional views of a substrate of semiconductive material processed at successive steps of a process of producing ultrahigh frequency semiconductor devices in accordance with another aspect of the present invention;

FIG. 5n is a fragmental plan view of the arrangement shown in FIG. 5m;

FIGS. 6A through 6E are views similar to FIG. 5 but illustrating an alternative of the process shown in FIG. 5; and FIGS. 7a through 7j are fragmental longitudinal sectional views illustrating a process of producing a large-scale integrated circuit in accordance with still another aspect of the present invention in the order of the manufacturing steps.

DESCRIPTION OF THE PREFERRED EMBODIMENTS

Figure 1A:
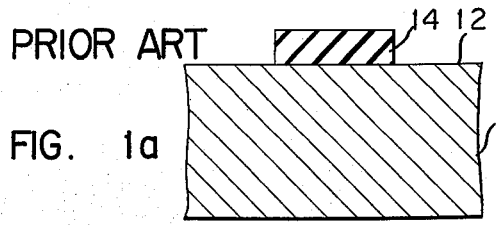
FIGS. 1a, 1b and 1c are fragmental longitudinal sectional views illustrating a so-called PLANOX or ISOPLANAR process of selectively forming oxide region on a substrate of semiconductive material at successive steps thereof in the ideal case.
Figure 1B:
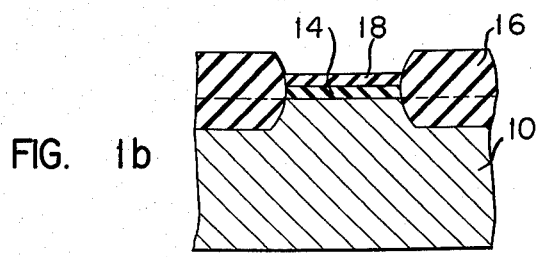
Figure 1C:
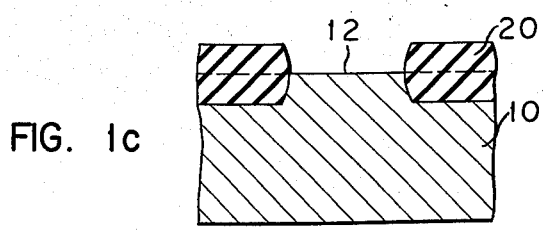

Referring now to the drawings and FIG. 1 in particular, there is illustrated a so-called PLANOX or ISOPLANAR process of producing semiconductor devices and more particularly of those steps of selectively oxidizing a surface of a substrate of semiconductive material in the order of the manufacturing steps. In FIG. 1a a silicon substrate 10 is shown as including a surface 12 and a coating 14 of silicon nitride ($Si_3N_4$) applied to the surface 12. It will readily be understood that a plurality of coatings of silicon nitride such as the coating 14 are selectively disposed in a predetermined pattern on the surface 12 of the substrate 10. When the substrate 10 as shown in FIG. 1a is oxidized in an oxidizing atmosphere at an elevated temperature, a structure as shown in FIG. 1b is yielded. As shown in FIG. 1b, that portion of the substrate's surface 10 not covered with the nitride coating 14 is oxidized to form a film 16 of silicon dioxide ($SiO_2$). At the same time the nitride coating 14 is partly oxidized to form a surface layer 18 of silicon dioxide. Then dilute hydrofluoric acid and hot phosphoric acid are successively used to remove the silicon dioxide layer 18 and the silicon nitride coating 14 respectively resulting in a structure as shown in FIG. 1c. That is, the substrate 10 has films of silicon dioxide selectively formed on the surface 12 thereof although only one silicon dioxide film 20 is illustrated.

Upon removing the layer and coating 18 and 14 respectively, the surface portion of oxide film 16 previously formed on the substrate's surface 12 is simultaneously removed so that the resulting oxide film becomes thinner and has its surface at a small difference in level relative to the exposed surface 12 of the substrate 10 although the difference in level is exaggerated only for purposes of illustration. The next suceeding step is to diffuse a conductivity imparting impurity into the substrate through the now exposed portions of the surface 12 thereof too form activated regions (not shown).

The use of the process as above described permits a decrease in a difference in level between the surface of the substrate and the surface of the silicondioxide film disposed thereon and is effective for reducing a tendency to break aluminum wire disposed on the substrate later on.

Figure 2:
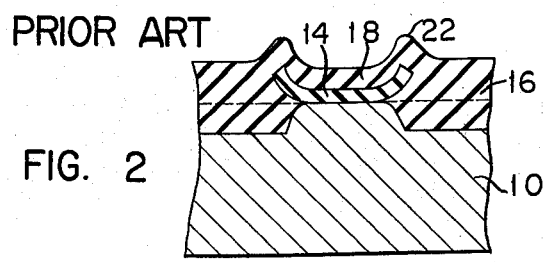
FIG. 2 is a longitudinal sectional view of one portion of the substrate after having the oxide regions formed according to the process shown in FIG. 1.

The above description has been made in terms of the ideal case of the PLANOX or ISOPLANAR process. Actually, an oxidizing agent such as oxygen or steam involved could be laterally diffused into that portion of the substrate directly under the nitride coating 14 at each boundary on the substrate's surface between that portion of the surface having disposed thereon the nitride coating and that portion of the surface not having disposed thereon such a coating. The diffused portion to increase oxidized to increase in volume resulting in the formation of a protrusion 22 on the surface of the oxide film 16 adjacent to the boundary as shown in FIG. 2. The protrusion thus formed is apt to break aluminum wire disposed thereacross later on. Therefore the advantages of the PLANOX or ISOPLANAR process have not been sufficiently attained.

In addition, since the silicon nitride coating 14 is directly applied to the surface 12 of the substrate 10, large lattice defects and high strains may be caused on that portion of the substrate's surface 12 contacted by the nitride coating 14 due to a difference in the coefficients of thermal expansion between the materials of the coating and substrate 14 and 10 respectively. This is undesirable from the viewpoint of the characteristics of the resulting semiconductor devices.

One approach to relieve the lattice defects and strains as above described is to coat a surface of a semiconductor substrate with a silicon nitride coating through a silicon dioxide film interposed therebetween as shown in FIG. 3 wherein like reference numerals designate the components identical or similar to those illustrated in FIG. 1.

Figure 3A:
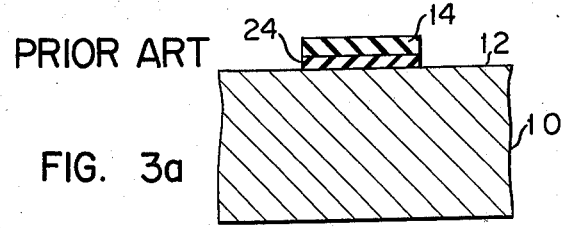
FIGS. 3a through 3d are views similar to FIG. 1 but illustrating an alternative of the process shown in FIG. 1.
Figure 3B:
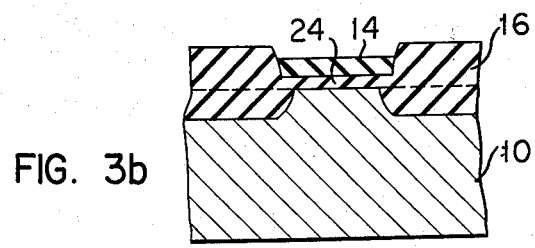

In FIG. 3a a substrate 10 formed of semiconductive silicon is shown as including a silicon nitride coating 14 disposed on the surface 12 thereof through a thin film 24 of silicon dioxide. It will readily be understood that a plurality of nitride coatings such as shown at 14 are selectively disposed on the surface 12 of the substrate 10 through respective thin oxide films such shown at 24. Then by oxidizing the substrate 10 with the coating and film 12 and 24 respectively in the same manner as above described in conjunction with FIG. 1, a silicon dioxide film 16 is formed on that portion of the substrate's surface 12 having the nitride coating not applied thereto as shown in FIG. 3b. As above described in conjunction with FIG. 2, an oxidizing agent such as oxygen or steam can be laterally diffused into the substrate to oxide that portion of the substrate 10 directly under the end portion of the nitride coating 14 on the border of the latter as shown in FIG. 3b.

Figure 3C:
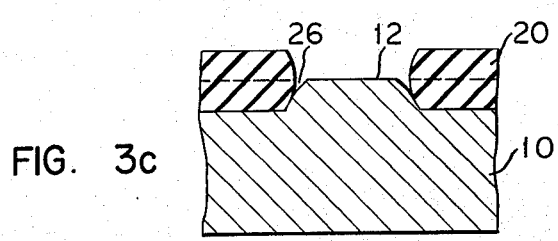

Then hot phosphoric acid or the like is first used to remove the silicon nitride coating 14 and then dilute hydrofluoric acid is used to remove the thin film 24 of silicon dioxide until the surface 12 of the substrate is exposed in a predetermined pattern. During the removal of the silicon-dioxide film, the dilute hydrofluoric acid operates to etch the silicon dioxide at an etching rate far higher than that for the silicon forming the substrate 10. Thus a recess or groove 26 is formed on the substrate's surface 12 on an edge portion of a thick film 20 of silicon dioxide as shown in FIG. 3c. As in the arrangement of FIG. 1c, the removal of the thin silicon dioxide film 24 is accompanied by the simultaneous removal of the surface of the oxide film 16 leaving the silicon dioxide film 20 somewhat thinner than the initial film 20.

Figure 3D:
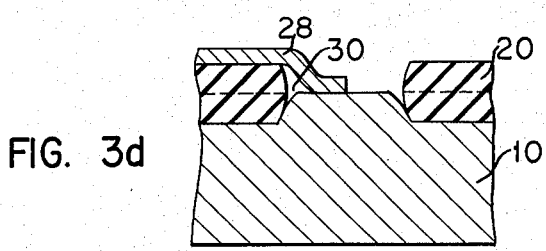

Thereafter a conductivity type imparting impurity can be diffused into the substrate 10 through the exposed portions of the surface 12 to form activated regions (not shown) in the substrate. Then an aluminum lead 28 can be disposed so as to bridge the oxide film and exposed surface 20 and 12 respectively as shown in FIG. 3d. FIG. 3d shows a cavity 30 confined by the aluminum lead 28, the end portion of the film 20 and the adjacent portion of the substrate's surface 12. That cavity 30 may cause the breaking of the aluminum lead 28. Thus the advantages of the PLANOX or ISO-PLANAR process can not be sufficiently attained.

Further the two processes as above described in conjunction with FIGS. 1 and 2 employ complicated treatments as compared with the use of silicon dioxide because the silicon nitride coatings are selectively applied to the surface of the substrate.

From the foregoing it will be appreciated that the PLANOX or ISOPLANAR process forms electrically insulating members selectively embedded in a surface portion of a semiconductor substrate so that those portions of the substrate's surface where no insulating members are formed for the purpose of forming activated regions later on and the surfaces of the insulating members can be made plane at least over the embedded portions. This results in a decrease in a tendency to break aluminum wires. However the processes are complicated treatments and have not completely prevented the breaking of aluminum wire.

The present invention is based upon the discovery that charged particles can be implanted in a semiconductor substrate to increase the oxidation velocity as compared with that portion of the substrate having no charged particle implanted therein. The invention contemplates to eliminate the disadvantages of the conventional PLANOX or ISOPLANAR process as above described.

Referring now to FIG. 4, there is illustrated a process of producing semiconductor devices according to one aspect of the present invention. In FIG. 4a it is seen that a substrate of any suitable semiconductive material such as silicon has a surface 12 on which a photoresist coating 40 is attached. Actually a plurality of photoresist coatings such as the coating 40 are selectively disposed in a predetermined pattern on the surface 12 of the substrate 10. The photoresist coatings 40 can interrupt or block accelerated charged particles incident thereupon. Preferred examples of the material of the coating 40 include, in addition to photoresists, silicon nitride ($Si_3N_4$) silicon dioxide ($SiO_2$) aluminum oxide ($Al_2O_3$) and metals blocking ions and easy to machine such as aluminum (Al) molybdenum (Mo) tungsten (W) etc. The coating 40 may be formed of a layer of any one of the compounds and metals as above described or a plurality of such layers superposed on one another. The material of the coating 40 is required only to block accelerated charged particles incident upon the coating and to be able to be selectively formed on the substrate's surface 12 in any suitable manner.

Figure 4A:
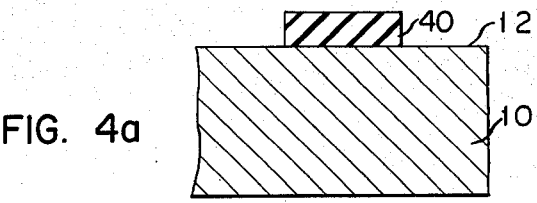
FIGS. 4a through 4e are fragmental longitudinal sectional views of a substrate of semiconductive material processed at various steps of a process of producing semiconductor devices in accordance with one aspect of the present invention.
Figure 4B:
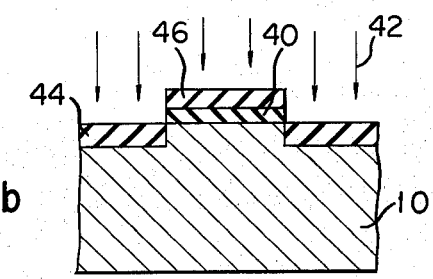

Implanted in the surface 12 of the substrate 10 are charged particles, for example, ions of any suitable element such as tin (Sn) after having been accelerated as shown by the arrows 42 in FIG. 4b to form implanted regions 44 in a predetermined pattern on the surface 12 while at the same time forming an implanted region 46 on the surface of each coating 40 as shown in FIG. 4b. Those ions can more effectively be ions of an element having a high atomic weight than a semiconductive material forming the substrate. For example, for a substrate 10 formed of silicon (Si), one may use ions of indium (In), gallium (Ga), antimony (Sb), tin (Sn) or arsenic (As).

The description will now be given in terms of ions of tin (Sn) being accelerated and implanted in the substrate but it is to be understood that the present invention is equally applicable to elements other than tin.

Figure 4C:
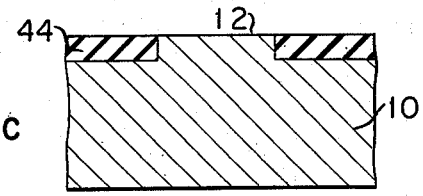

The photoresist coatings 40 are removed from the substrate 10 in a well known manner using, for example, hot sulfuric acid to expose the selected portions of the substrates surface 12 while leaving the implanted regions 44 in the surface portion of the substrate 10 so as to be substantially flush with the exposed substrate's surface. The resulting structure is shown in FIG. 4c.

Figure 4D:
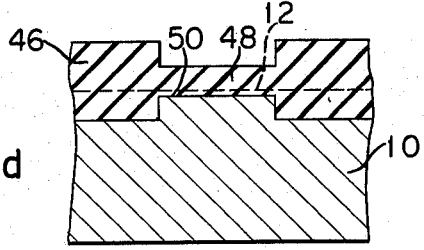

Then the substrate 10 thus processed is heated in an oxidizing atmosphere such as oxygen or steam. During this heat treatment the oxidation of those portions of the substrate's surface 12 where the implanted regions 44 have been formed are accelerated to form thick films 46 of silicon dioxide while those portions of the surface 12 in which no ions have been implanted have formed thereon a thin film 48 of silicon dioxide as shown in FIG. 4d. While the mechanism by which the implanted regions are oxidized at a higher oxidizing velocity is not exactly understood it is believed that the crystallographic structure of the implanted regions will be changed by having the accelerated charged particles implanted therein so that the implanted regions are more rapidly oxidized than the remaining regions of the surface 10 during the same oxidizing time.

In FIG. 4d the dotted line designates the surface 12 of the substrate 10 as shown in FIG. 4a or 4b and the reference numeral 50 denotes the surface of the substrate now formed directly under the thin layer 48 of silicon dioxide.

It is to be noted that the oxidation proceeds somewhat along the surface of the substrate so that the surface 50 is slightly smaller in dimension than the surface 12 defined by the opposite portions of the injection region 44.

Figure 4E:

Subsequently the thin film 48 of silicon dioxide is removed from the substrate 10 as by dilute hydrofluoric acid. At that time one portion of the thick film 46 is being simultaneously removed from the substrate 10. The removal of silicon dioxide continues until that portion of the substrate's surface 50 directly under each of the thin silicon-dioxide films 48 is exposed. The resulting structure is shown in FIG. 4e. As shown in FIG. 4e, the thick film 46 has been partly removed to form a film 52 of silicon dioxide having a slightly different level relative to the exposed surface 50 of the substrate 10.

The next succeeding step is to form activated regions (not shown) in the surface portions of the substrate 10 as above described in conjunction with FIGS. 1 and 3. Then aluminum wire can be disposed on the substrate 10. Some of the wire can bridge the silicon dioxide films 52 and the adjacent portions of the exposed substrate's surface 50. Due to a small difference in level between the two as above described, the chance of breaking the aluminum wire is reduced.

If it is desired to increase the impurity concentration of that portion of the substrate 10 directly under each of the silicon dioxide films 52, the charged particles may be formed of Group III elements such as indium for P type conductivity and of Group V elements such as antimony for the N type conductivity. The use of charged particles formed of ions of tin is advantageous in that lattice defects and strains in the implanted region can be relieved thereby to prevent those portion of the substrate directly under the films 52 from tending to be of N type conductivity.

The present invention has been described in terms of the provision of the photoresist coatings selectively disposed on the substrate to selectively form the implanted regions on the substrates followed by the conversion of the material of the implanted regions to an electrically insulating material. However a beam of charged particles may be selectively implanted in the substrate and the photoresist coatings omitted within the scope of the present invention. Also the oxidation step has been described as being effected after the removal of the photoresist coatings but, if desired, the oxidation step may be effected with the silicon nitride coatings still left on the substrate.

In order to form an insulating oxide more deeply extending into the interior of the substrate, relatively light ions such as protons or helium ions may be implanted in the substrate after which the charged particles whose atomic weight is larger than that of the atoms forming the substrate are implanted in the latter.

From the foregoing it will be appreciated that the present process as above described permits the oxide insulations to be rapidly and simply formed in a predetermined pattern in the substrate without the necessity of using the complicated steps previously required. Thus semiconductor devices can be produced which have the desired characteristics and are high in reliability.

Referring now to FIG. 5 wherein like reference numerals designate components identical or similar to those shown in FIG. 4, there is illustrated a process of producing ultrahigh frequency semiconductor devices in accordance with another aspect of the present invention, in the order of processing steps thereof.

In the process as illustrated in FIG. 4 a beam of ions has been used as accelerated charged particles to accelerate the oxidation. It is to be understood that any of a beam of electrons, neutron flux, or radioactive radiation may be used for the same purpose. Among them, however, the beams of ions have the widest variety and therefore the description will now be typically described in terms of a beam of ions.

In FIG. 5a a coating 40' formed of a material serving to block or shield a beam of ions for example, silicon dioxide, silicon nitride, photoresist or the like is applied to a silicon substrate 10 on the upper surface 12. As above described, examples of the shielding material include silicon dioxide, silicon nitride; photoresist etc. While FIG. 5a shows a single coating 40, a plurality of coatings such as coating 40 are actually disposed in a predetermined pattern on the substrate 10 by jointly employing a selective etching technique well known in the art for example, chemically etching, back spattering or plasma etching technique and a photolithographic technique also well known in the art. Only for purposes of illustration the substrate will be described as including the single coating 40'. The thickness of the shielding coating 40' depends upon an acceleration voltage for a beam of ions involved and the type of coating material. It has been found that, with the coating formed of silicon dioxide, the thickness thereof is sufficient in the range from 500 to 700A at an acceleration voltage of 100 kilovolts and from 1000 to 1500A at an acceleration voltage of 200 kilovolts. For photoresist coatings, the thickness thereof is required only to be twice the thickness of the silicon dioxide coating. In the example illustrated the coating 40' has been formed into a square of a photoresist.

As shown in FIG. 5b a beam of ions 42 irradiates the upper surface 12 of the substrate 10 to form regions 44 having a fast oxidizing ability. A source of ions includes preferably an element heavier than the element, in this case, silicon forming the substrate (10), for example, indium, gallium antimony, tin or arsenic as above described in conjunction with FIG. 4b although the source of ions may be formed of any other element.

Then the shielding coating 40' is removed from the substrate 10 by a well known selective etching technique as above described. Thereafter the upper surface 12 of the substrate 10 is oxidized in a high temperature oxidizing furnace including a suitable oxidizing atmosphere such as oxygen or steam at a temperature above 900°C. During this oxidation, the regions 44 irradiated with the beam of ions 40 have a high oxidizing velocity as compared with the remaining portion of the substrate's surface 12 or that portion of the substrate previously overlaid with the shielding coating 40'. By properly selecting the type of ion beam, ionic current, acceleration voltage for the ion beam, conditions for thermal oxidation after the irradiation with the beam of ions such as the type of oxidizing atmosphere, oxidizing temperature, oxidizing time etc., the ratio of oxidizing velocities between the regions 44 and the remaining portion of the substrate's surface can be of a desired magnitude.

FIG. 5c shows the resulting structure after having been oxidized at the desired magnitude of the ratio of oxidizing velocities.

As shown in FIG. 5c, the silicon dioxide film 46 formed in the irradiated region 44 is different in thickness from the silicon dioxide film 48 formed on that portion of the substrate's surface exposed after the removal of the mating shielding coatings 40' with the film 48 formed at an oxidizing velocity inherent to the semiconductive material of the substrate 10. Therefore the interface between the film 46 and the adjacent portion of the substrate 10 is positioned closer to the other or bottom surface of the substrate 10 than the interface between the film 48 and the adjacent portion of the substrate 10 with the result that at least one portion of the silicon dioxide film 46 is embedded in the substrate 10. In addition, that portion of the film 46 closer to the bottom surface of the substrate 10 than the interface between the film 48 and the adjacent portion of the substrate includes an inwardly projecting extension to form a region composed of the original semiconductive material, in this case silicon, between the opposite portions thereof. That region has a length of $L_1'$, (see FIG. 5c) smaller than that of the exposed surface of the film 48 equal to length $L_1$ of the associated coating 40' as shown in FIG. 5a. The extension results from both a difference in the oxidizing velocity between the films 46 and 48 and the oxidation of the semiconductive material or silicon proceeding inwardly in the horizontal direction and along the interface between the film 48 and the adjacent portion of the substrate (10) due to the mechanism by which the substrate is oxidized. The extension is exaggerated in FIG. 5 only for the purposes of illustration.

Subsequently a well known etching technique such as above described is used to remove one portion of the films 46 and the film 48 until the interface between the film 48 and the adjacent portion of the substrate 10 is exposed to form a window 54 for base diffusion as shown in FIG. 5d. The window 54 has a length of $L_1'$ less than that of the shielding coating 40' designated by $L_1$. Assuming that the film 46 has a thickness of D and that portion thereof disposed under the surface of the substrate 10 has a thickness of $D_1$, the difference in thickness of $D-D_1$ and the difference in length of $L_1-L_1'$ can be set to the desired magnitudes by properly selecting the ratio of oxidizing velocity between the films 46 and 48 or the requirements for the irradiation with a beam of ions and those for the oxidation after that irradiation.

Following the formation of the window 54, a selective diffusion technique well known in the art is used to form thick base diffusion regions 56 $X_{jB}$ in those portions of the substrate directly under the windows 54 thereby to form a base junction therebetween. Thereafter a silicon dioxide film (not shown) grown in the window 54 is chemically etched away. The resulting structure is shown in FIG. 5e. Simultaneously with the removal of the film grown in the window, the silicon dioxide films 46 are partly etched to decrease their thickness to the overall thickness of D. The effective thickness D of the silicon dioxide films 46 can be large while the thickness $D-D_1$ of that portion of the film 46 above the surface of the substrate is kept comparable with a corresponding thickness in semiconductor devices produced by conventional processes.

Then a coating 58 with a predetermined shape for shielding a beam of ions is disposed at its a predetermined position or positions on the upper surface of the base diffusion region 56 in the substrate 10 in the manner as above described in conjunction with FIG. 5a. As seen in FIG. 5f, the shielding coating 58 includes three spaced parallel portions having widths of $L_2$, $L_3$ and $L_2$ respectively. The coating 58 can be utilized to form windows for a base electrode, emitter diffusion and an emitter electrode later on.

The next succeeding step is to irradiate the upper surface of the structure as shown in FIG. 5f with a beam of ions 42 to form a region 60 having the fast oxidizing ability property as above described in conjunction with FIG. 5b. The resulting structure is shown in FIG. 5g.

The thickness of the region 60 can readily be controlled in accordance with the requirements for the beam of ions 42 for example, the acceleration voltage therefor and others. More specifically, the thickness of the region 58 can be of a desired magnitude capable of effecting the emitter diffusion and of providing a width of an emitter stripe sufficient to fulfill the high frequency characteristics of the resulting semiconductor devices without breaking down the base junctions formed in the step as shown in FIG. 5e.

Then the step as above described in conjunction with FIG. 5c is repeated to grow on the base diffusion region 56 a fast oxidized film 62 partly embedded in the region 56 and a normally oxidized film. The resulting structure is shown in FIG. 5h. As in the structure shown in FIG. 5c, the embedded parallel portions of the film 60 have their lower surfaces closer to the base-to-collector junction than the lower surface of the normally oxided film formed in that portions of the substrate previously covered with the shielding coating 58. Also the embedded parallel portions of the film 58 sandwich silicon regions therebetween the lengths of $L_2'$, $L_3'$ and $L_2'$ of which smaller than those the regions shielded in the step as shown in FIG. 5f and designated by $L_2$, $L_3$ and $L_2$.

By utilizing the mechanism by which the fast oxidized film is grown, it is possible to decrease the size of a window for emitter diffusion previously formed to the critical size as determined in the field of photolithographic technique while greatly increasing the ratio of the perimeter to the area of an emitter. This results in means very effective for producing semiconductor devices and more particularly ultrahigh frequency semiconductor devices.

Then in order to selectively etch the silicon dioxide film for the purpose of providing a window for emitter diffusion, a well known photolithographic technique is utilized to apply a coating 64 for selectively etching the silicon dioxide film 46, for example, a photoresist coating on the upper surface of the structure as shown in FIG. 5h except for that portion thereof where the window for emitter diffusion is to be formed. The resulting structure is shown in FIG. 5i wherein a central one of the recesses between the film 62 portions is shown as being destined for a window through which the emitter diffusion is accomplished.

Following this a suitable photo-etching technique is utilized to chemically etch the coating 64 and that portion of the silicon dioxide film destined for the emitter window to form a window 66 for emitter diffusion as shown in FIG. 5j.

Thereafter a desired impurity for emitter diffusion is diffused into the substrate or the base diffusion region 56 through the window 66 to form an emitter diffusion region 68 with an emitter junction formed between both regions 68 and 56. The resulting structure is shown in FIG. 5k. During this emitter diffusion it is to be noted that the diffusion length $X_{jE}$ should not exceed the thickness of those portions of the films 60 disposed under the exposed surface of the window 66, this thickness being designated by $D_2$ in FIG. 5j. This measure prevents the resulting junction from having a curvature and also the emitter-collector junction to withstand a very greatly increased voltage as compared with junctions formed by conventional processes.

Further the diffusion carried out in such an atmosphere that a silicon dioxide film 70 is formed in the emitter window 66 is important in relation to the next succeeding step of disposing windows for emitter and base electrodes in the silicon dioxide film.

FIG. 5l shows the structure after windows 72 and 74 for emitter and base electrodes have been formed in the silicon dioxide film 62. It is possible to simultaneously dispose those windows between the film 60 portions by immersing the substrate 10 in a solution for etching the silicon dioxide film for example, in a solution of ammonium fluoride to chemically etch the silicon dioxide film on the substrate 10 uniformly over the entire area thereof without subjecting the silicon dioxide film grown in that portion of the substrate previously having the shielding coating 58 thereon (FIG. 5f) and the silicon dioxide film 68 grown in the wondow 66 during the emitter diffusion (FIG. 5k) in photolithographic treatment. The chemical etching is completed when one "sees" the surface of the substrate 10 through both windows 72 and 74.

In the structure of FIG. 5l, the junctions for the emitter and base diffusion regions have respective peripheries encircled with the fast oxidized film 62 and 46. Thus the ends of the junctions are prevented from reaching the main surfaces 54 and 66 respectively of the diffusion regions 56 and 68 as in diffusion regions in the prior art type semiconductor devices. Therefore even though the silicon dioxide films disposed in the electrode windows would be chemically etched to a somewhat excessive extent, the ends of the junctions are prevented from being immediately exposed to the upper surface of the substrate. Rather by chemically etching the silicon dioxide film insufficiently to expose the bottom surface of the emitter region, the result is given that the effective contact area with an electrode can obtained be increased. Therefore the facility of the control of the oxide etching step for forming the windows for the emitter and base electrodes augmented which contributes to the stabilization of that step.

Then a metal suitable for use as the electrode for semiconductor devices is applied to the upper surface of the structure as shown in FIG. 5l in the manner well known in the art. To this end, any technique such as vacuum evaporation, sputtering etc. may be utilized while a metal such as aluminum or a combination of a plurality of metals for example, a combination of platinum silicide, titanium, molybdenum and gold in the form of superposed laminations or the like may be applied to the upper surface of the structure as shown in FIG. 5l. Thereafter well known photo-etching is utilized to etch away the applied metal so as to leave the metal portions in the desired positions on the surface of the structure. This results in the formation of an emitter and base electrode 76 and 78 respectively as shown in FIG. 5m.

After the configuration of the electrodes has been formed by photolithographic technique, a heat treatment is effected in order to enhance the adhesion of the metal of the electrodes to the silicon dioxide film and to cause the metal to contact the silicon substrate with a low resistance. During this heat treatment, the reaction of the electrode metal on the silicon forming the substrate may cause the metal to enter the substrate in the direction of the depth thereof. Alternatively the metal may laterally enter the interface between the electrode and the substrate. This may cause a problem that the junctions and more particularly the emitter junction will be broken down. In order to limit that reaction in the direction of depth of the substrate, there have been previously proposed many steps such as the utilization of metal silicides, the use of multiple-layer electrodes and so on. However the breakdown due to the reaction has a bearing on the control of the step of chemically etching the windows in which the overlay type electrodes are disposed. In conventional processes it has been difficult to completely avoid that breakdown.

In contrast, the process according to the present invention permits the periphery of the internal junction for the emitter region to be encircled with the adjacent silicon dioxide film thereby to put the ends thereof within the substrate. Therefore the breakdown due to the reaction of the electrode metal upon the silicon can be completely prevented which is one of the characteristic features of the present invention.

FIG. 5n is a plan view of the structure wherein the base electrode 76 is shown as having a U-shape while the emitter electrode 74 is put between the legs of the "U". The emitter and base electrodes 76 and 78 respectively extend beyond the surface of the silicon dioxide film 46 in an overlay structure so that an additional capacitance is present between each of the electrodes and the collector region. However these additional capacitances can be decreased by reducing the thickness of the silicon dioxide film 46. In the conventional processes, however, an increase in the thickness of the silicon dioxide films 46 has resulted in an increase in the difference in level between the substrate 10 and the silicon dioxide film leading to breaking down of connections to the electrodes. Therefore the film has not been able to be very thick.

The process as shown in FIGS. 5a–5n can greatly increase the yield of the product.

The process as above described in conjunction with FIGS. 5a–5n can be modified as shown in FIGS. 6A–6E wherein like reference numerals designate the components identical to those illustrated in FIG. 5. In this modified process the steps as shown in FIGS. 5a through 5e are repeated so that the next succeeding step et seq will now be described in conjunction with FIGS. 6A through 6E.

A silicon substrate 10 having the structure as shown in FIG. 5e has a shielding coating 58 disposed at a predetermined position on an upper surface of a base diffusion region 56 previously formed in the same and in the manner as above described in conjunction with FIG. 5a. The film 58 is operative to shield a beam of ions and can be utilized to form windows for emitter diffusion and an emitter electrode later on.

Then as shown in FIG. 6B, a beam of ions 42 irradiates the upper surface of the structure as shown in FIG. 6A to form a region 60 having a thickness as determined by the requirements as above described in conjunction with FIG. 5g. The region 60 has a fast oxidizing property.

Thereafter the substrate 10 is subjected to a high temperature oxidation treatment in a suitable atmosphere as above described in conjunction with FIG. 5c to form a fast oxidized region 62 upon and in the base diffusion region 56. It is to be noted that the region 62 retains the characteristic feature that a window for emitter diffusion provided on the base diffusion region 56 later on has a width less than that obtained upon photolithographing. The resulting structure is shown in FIG. 6C.

Then by utilizing the difference in thickness between a silicon dioxide film grown upon that portion of the substrate destined for an emitter diffusion region and the fast oxidized region disposed around the latter, the entire area of the silicon dioxide film upon the upper surface of the substrate 10 is uniformly etched with any suitable etching solution such as above described in conjunction with FIG. 5l to form a window 66 for emitter diffusion as shown in FIG. 6D. It is noted that no photolithographic technique is required.

In the structure of FIG. 6D the emitter diffusion is accomplished as above described in conjunction with FIG. 5k and then a photo-etching technique well known in the art is used to form windows 72 and 74 for emitter and base electrodes. The resulting structure is shown in FIG. 6E. An emitter junction terminates at the adjacent fast oxidized region without coinciding with the surface of the emitter diffusion region. Therefore the process as above described in conjunction with FIG. 6 still retains the two characteristic features of a decrease in the capacitance incidental to the lateral surface of the fast oxidized film and an increase in the facility of the chemically etching operation of removing the silicon dioxide film in the emitter window upon removing the silicon dioxide film in a window for an emitter electrode.

Electrodes can then be disposed in the windows 72 and 74 and the connection to the electrodes can be effected in a well known manner to complete a semiconductor device. In that device the base of window 74 is substantially flush with the lower surface of the film 68 (see FIG. 6E) so that the difference in level between the base window 74 and the bottom surface of the emitter diffusion region 66 is smaller than that obtained by the process as shown in FIG. 5. This is effective for decreasing base spreading resistance.

Where semiconductor devices are produced through the utilization of the fast oxidized film as above described the following advantages are attained:

1. The overall thickness of a silicon dioxide film (which is called hereinafter an oxide film) can increase without an increase in the thickness of that portion of the film disposed upon the surface of a semiconductor substrate.

Therefore, in semiconductor devices constructed so that overlay type electrodes are disposed on the oxide film, an additional capacitance due to that portion of the oxide film disposed between each of the base and emitter electrodes and the collector can be reduced without breaking connections to the electrodes. In other words, by properly selecting the requirements for irradiation with any of a beam of ions, a beam of electrons, neutron flux, radioactive radiation etc. and the requirements for heat treatment after that irradiation, the oxide film formed by the present invention can be controlled so that the overall thickness of the film is maintained great while that portion of the film disposed upon the surface of the substrate can be adjusted to a suitable thickness;

2. It is possible to form any desired pattern finer than the fine pattern permissible in the field of the conventional photolithographic technique employing an optical system.

By forming first an oxide film and then a pattern, according to the present invention, it is possible to form any fine pattern having a minimum permissible stripe width of 1.0 micron or less. More specifically, a material in the form of a coating capable of shielding a beam of ions, a beam of electrons or the like is first applied to that surface of a semiconductor substrate on which a pattern is to be formed in the desired configuration. As above described, the shielding material may be silicon dioxide, silicon nitride, photoresist etc. Then a photolithographic technique well known in the art is used to describe a fine pattern having the desired stripe width of L on the coating. Thereafter a beam of ions, a beam of electrons or the like irradiates the surface of the substrate bearing the pattern to impart a fast oxidizing property to those regions of the substrate's surface not covered with the shielding coating as desired. After the irradiation, the shielding coating is suitably removed from the substrate and then the latter is heated in a suitable oxidizing atmosphere such as an atmosphere of wet oxygen at 900°C or higher for a desired time to oxidize the surface of the substrate. This results in a pattern corresponding in configuration to but smaller in stripe width than the initial fine pattern of that portion of the fast oxidized region embedded in the substrate. Thus the resulting width $L'$ is smaller than the original width of $L$.

Subsequently that portion the oxide film formed on the non-irradiated region of the substrate's surface is etched away by means of a suitable chemically etching solution for example, hydrofluoric acid. This results in desired windows with the stripe width $L'$ finer than the initial width $L$ being formed in the oxide film on the surface of the substrate.

3. The fast oxidation is utilized to form the electrically insulating oxide film having at least one portion embedded in the substrate. Thus the insulating film includes a thick portion. By utilizing that insulating film as a diffusion shielding film, the diffusion is effected to form a junction encircled with that portion of the insulating film embedded in the substrate. The resulting junction has ends not coinciding with the main surface of the diffusion region. Therefore the voltage withstood by the junction can be higher than that previously obtained.

When the junction is formed in the substrate at a depth less than the thickness of the portion of the fast oxidized film embedded in the substrate thereby to prevent the junction from having a curvature, the voltage withstood by the junction becomes higher. As above described, a junction without a curvature connected to a diffusion region reduces an additional capacitance attendant to the diffusion region which capacitance is not negligibly low for ultrahigh frequency semiconductor devices. More specifically, the fast oxidized film can be utilized to form a diffusion region including a junction with no curvature into a fine pattern having a stripe width ranging, for example, from 1.0 to 1.5 microns as in the emitter regions of ultrahigh frequency semiconductor devices. The diffusion region thus formed has an additional capacitance consisting only of a capacitance occurring between the bottom surface thereof and the associated collector region. Thus the additional capacitance can be decreased by a capacitance incidental to the lateral surface of the diffusion region.

4. Upon disposing windows for electrodes in the oxide film, the photo-etching step is facilitated and particularly for the emitter electrode of ultrahigh frequency semiconductor devices.

As above described, the diffusion region formed through the utilization of the fast oxidized film does not have its surface flush with the ends of the associated junction. Therefore even though the oxide film would be chemically etched to a somewhat excessive extent, it is ensured that the junction is not exposed at the end or ends to the main surface of the semiconductor substrate.

Referring now to FIG. 7, there is illustrated a process of producing a large-scale integrated circuit in accordance with still another aspect of the present invention utilizing the phenomenon that polycrystalline silicon has a higher oxidizing velocity than silicon in the form of a single crystal, in addition to the above-mentioned discovery that crystalline silicon irradiated with a beam of ions or the like has a higher oxidizing velocity than silicon not irradiated therewith.

In FIG. 7a a substrate 100 formed of a single crystal of silicon with one type conductivity (for example P type conductivity) is shown as including a main surface which is irradiated with a beam of ions of an impurity imparting the same conductivity as the substrate, the ions being implanted after having been accelerated. Thus the ions are implanted in the entire main surface of the substrate. The accelerated ions are designated by the arrows 102 in FIG. 7a. Suitable examples of the impurity are boron, gallium, indium etc. and the impurity is preferably implanted in the substrate with a surface impurity concentration of about $10^{14}$ atoms square centimeter.

The implanting of the impurity ions is to prevent the occurrence of the so-called channel phenomenon that the main surface of the substrate is partly inverted to be of the opposite type conductivity in the next succeeding step. If a silicon dioxide film can be disposed on the main surface of the substrate 100 while the channel phenomenon is prevented from occurring then the implanting of the impurity ions may be omitted.

Subsequently a silicon dioxide layer 104 is suitably disposed on the main surface of the substrate 100 having the ions implanted therein and then a well known photo-etching technique is used to partly remove the layer 104 to form openings 106 (only one of which is illustrated). Thereafter any suitable impurity imparting the conductivity opposite to that of the substrate, for example, arsenic, phosphorous or the like is selectively diffused into the substrate 100 through the openings 106 to form $N^+$ type layers 108 embedded in the substrate 100. The resulting structure is shown in FIG. 7b.

Following this, an epitaxial growth technique well known in the art is used to grow silicon upon the entire surface of the substrate. During this epitaxial growth N type silicon in the form of a single crystal is grown upon the embedded $N^+$ type layers 108 to form an N type layer 110 thereon while a polycrystalline silicon layer 112 is grown upon the silicon dioxide layer 104 as shown in FIG. 7c.

Then a silicon nitride ($Si_3N_4$) coating 114 is disposed on both silicon layers 110 and 112 as shown in FIG. 7d after which that portion of the silicon nitride coating 114 disposed on the polycrystalline silicon layer 112 is removed therefrom by a photo-etching technique well known in the art. The resulting structure is shown in FIG. 7e. In order to prevent that portion of the silicon nitride coating 114 disposed on the N type epitaxially grown layer 110 from being etched, masks 116 formed, for example, of a photoresist film, a silicon dioxide film or a mixture thereof have been disposed upon the respective grown layers 110.

Subsequently the polycrystalline silicon layer 112 is selectively etched to decrease its thickness while the mask 116 is still disposed on the grown layers 110. It has been found that the resulting thickness of the layer 112 is preferably equal to about the difference in thickness between the polycrystalline layer 112 and the silicon dioxide film 104 divided by a factor of from 2 to 2.5. If the N type grown layer 110 is on the order of 2 microns or less thick then the thickness of the layer 112 after having been etched may be approximately equal to that of the silicon dioxide film 104. Alternatively, if there is no problem of breaking connections of elements to one another in the resulting integrated circuit then the step just described may be omitted. In short, the step of reducing the thickness of the polycrystalline silicon layer 112 does not form one of the essential parts of the present invention and may be conducted whenever it is necessary to do so.

Figure 7F:
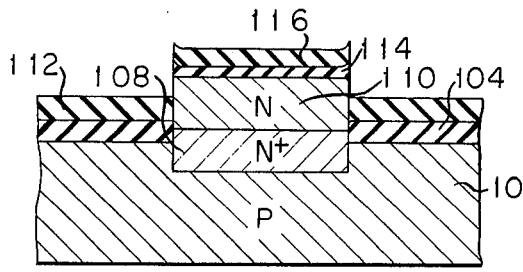
Figure 7G:
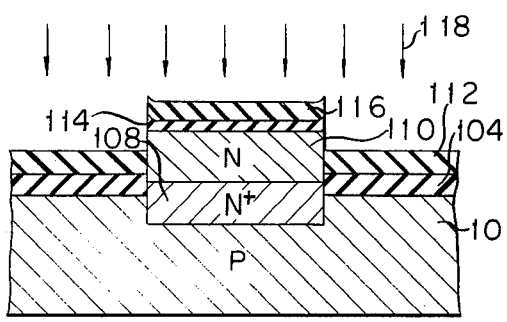

Then after having been accelerated, charged particles such as ions of a suitable element, for example tin ions are caused to bombard the silicon substrate having the structure as shown in FIG. 7f (see FIG. 7g) wherein the reference numeral 118 designates the charged particles. Under these circumstances, the accelerated charged particles are only implanted in the polycrystalline silicon layer 112 because the layer 112 is not covered with the silicon nitride film coating 114 or the mask 116 serving to prevent the ions from entering the same. If an element larger in atomic weight than silicon is used to bombard the silicon substrate, this will give more effective results. The electrical energy required for the bombardment of the ions is preferably of at least 200 KeV. Also ions of argon, xenon or the like may be used.

Figure 7H:
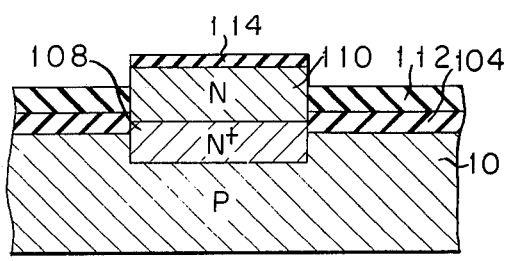

Following the bombardment with the ions, the masks 116 are suitably removed from the substrate and then the substrate having a structure as shown in FIG. 7h is subject to heat treatment in an oxidizing atmosphere at a high temperature. At that time, the polycrystalline silicon forming the layer 112 is converted to silicon dioxide to form a silicon dioxide layer 120 having an increased thickness while the layer 110 formed of N type silicon in the form of a single crystal is not oxidized because of the presence of the silicon nitride coating 114 which is effective for masking the oxidizing atmosphere.

The characteristic features of the present invention are to utilize both the discovery that the silicon layer having ions implanted therein has a higher oxidizing velocity than that having no ion implanted therein as above described and the phenomenon that the polycrystalline silicon has a higher oxidizing velocity than silicon in the form of a single crystal.

As an example, it is assumed that the epitaxially grown layer 110 of silicon in the form of a single crystal is 2 microns thick, the silicon dioxide film 104 is 1 micron thick and the polycrystalline silicon layer 112 with the injected ions is etched to a thickness of 0.4 micron. Under the assumed condition, heat treatment in an atmosphere of wet oxygen at 1100°C for a heating time of about 40 minutes has caused the polycrystalline silicon layer 112 to be changed to the silicon dioxide layer 120 resulting in the structure as shown in FIG. 7i.

Figure 7I:
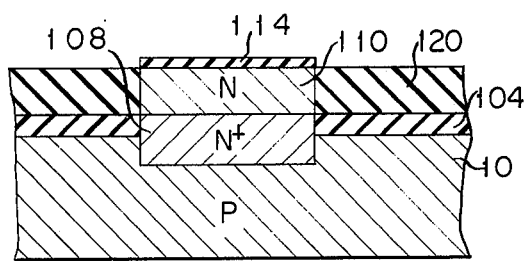

However with the layer 110 formed of silicon in the form of a single crystal having no implanted ions, the heat treatment is required to be effected for 170 minutes in order to produce a structure such as shown in FIG. 7i with the other conditions for heat treatment remaining unchanged. In other words, the oxidizing time required for the ion implanted polycrystalline silicon layer decreases to about one quarter that required for the monocrystalline silicon layer without implanted ions. This reduction in the oxidizing time causes the degree of diffusion from the embedded region 108 into the $N^+$ type layer 110 during the heat treatment to decrease to about one half or less. Thus it is possible to prevent a decrease in the thickness of the effective epitaxial layer available for use in forming an active or a reactive region whereby transistors in the resulting integrated circuit can be prevented from having a decreased voltage withstood by the associated base-to-collector junction.

Then the silicon nitride coating 114 is etched away and thereafter a planar technique well known in the art is used to form successively a P type base region 122 in the N type layer 110 and an N type emitter region 124 in the base region 122 with a silicon dioxide layer 126 simultaneously disposed on the surfaces of the layers 110 and 112 and the regions 122 and 124. The resulting structure is shown in FIG. 7j.

Figure 7J:
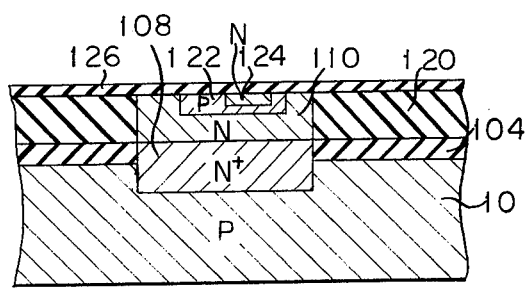

The structure of FIG. 7j including active and or reactive elements thus formed has in the silicon dioxide layer 126 openings for electrodes and then connections are made between the elements to complete the integrated circuit although the openings, electrodes etc. not being illustrated.

As above described, the process of producing an integrated circuit through the utilization of an increase in the oxidizing velocity of the polycrystalline silicon implanted with ions makes it possible to decrease the time of high temperature heat treatment required for forming separation regions between the elements. This reduces the change in the impurity distribution previously formed in the substrate and more particularly restrains the impurity in the embedded region from being diffused toward the associated base-to-collector junction thereby to prevent a decrease in the voltage withstood by that junction. Thus one can readily design integrated circuits. Also since the deviation in the depth of the base-to-collector junction from one to another of the semiconductor elements can be decreased, the steps of effecting the emitter diffusion, controlling the degree of current amplification and so on can be stabilized. In addition, due to a decrease in the time of high temperature treatment, it is also possible to alleviate strains developed in silicon in the form of a single crystal during that heat treatment caused from a difference in the coefficients of thermal expansion between silicon nitride and the silicon. From the foregoing it will be appreciated that integrated circuits having excellent electric characteristics are produced.

Also upon manufacturing large-scale integrated circuits, the formation of separation regions by oxidizing polycrystalline silicon implanted with ions permits the oxidizing velocity to be effectively increased only in the direction of depth of the substrate due to the implanting of ions while the implanted ions spread substantially negligibly in the transverse direction of the substrate. This permits the resulting large-scale integrated circuit to be of a higher density.

What we claim is:

1. A process of producing semiconductor devices, comprising the steps of irradiating selected portions of a surface of a substrate of semiconductive material with accelerated charged particles to selectively form regions having a fast oxidizing property on said selected surface portions, heating said substrate with said regions in an oxidizing atmosphere to form an oxide film on said surface of said substrate, selectively removing said oxide film from those regions of said surface of said substrate not irradiated with the charged particles, to expose said regions of said surface, and diffusing a conductivity imparting impurity into said exposed surface regions of said substrate to form junctions terminating at those portions of the oxide film embedded in said substrate.

2. A process of producing semiconductor devices comprising the steps of selectively disposing on a surface of a substrate of semiconductive material with a first conductivity both a layer of semiconductive material with a second conductivity in the form of a single crystal and a layer of polycrystalline semiconductive material, implanting accelerated charged particles in said layer of polycrystalline semiconductive material, and heating said layer of polycrystalline semiconductive material implanted with said charged particles in an oxidizing atmosphere to convert the semiconductive material of said polycrystalline layer to an oxide insulation.

3. A process of producing semiconductor devices comprising the steps of forming on selected portions of a surface of a substrate of semiconductive material coatings for blocking charged particles, irradiating said surface of said substrate with accelerated charged particles to implant said charged particles into those regions of said surface of said substrate on which said coatings are not formed to form implanted regions having a fast oxidizing property on said uncoated regions, removing said coatings from said surface of said substrate heating said substrate in an oxidizing atmosphere to grow an oxide insulation upon said surface of said substrate including said regions implanted with the charged particles, and selectively removing said oxide insulation from said surface of said substrate to expose said selected portion thereof.

4. A process of producing semiconductor devices, as claimed in claim 3, wherein said coating for blocking the charged particles is a film of a material selected from the group consisting of a silicon nitride film, a silicon dioxide film, aluminum oxide film, an aluminum film, a molybdenum film, a tungsten film and mixtures thereof.

5. A process of producing semiconductor devices as claimed in claim 3, wherein said substrate is silicon in the form of a single crystal and wherein said charged particles are ions of an element selected from the group consisting of indium, gallium, antimony, tin and arsenic.

6. A process of producing semiconductor devices comprising the steps of forming on selected portions of a surface of a substrate of semiconductive material first coatings for blocking charged particles, irradiating said surface of said substrate with accelerated charged particles to implant the charged particles in those regions of said surface of said substrate not coated with said first coatings, removing said first coating from said surface of said substrate, heating said substrate in an oxidizing atmosphere to grow an oxide insulation on said surface of said substrate including said regions in which the charged particles have been implanted, selectively removing said oxide insulation from said surface of said substrate to expose selected surface portions of said substrate, diffusing a first conductivity imparting impurity into said exposed surface portions of said substrate to form first diffusion regions in said substrate, selectively forming on said exposed surface portions of said substrate second coating for blocking charged particles, implanting second charged particles in those regions of the exposed surface portions of said substrate not coated with said second coatings to form second implanted regions in said substrate, removing said second coatings from said surface of said substrate, heating said substrate in an oxidizing atmosphere to grow a second oxide insulation on said surface of said substrate including said regions in which the second charged particles have been implanted, selectively removing said second oxide insulation from said surface of said substrate to expose partly said surface of said substrate, and diffusing a second conductivity imparting impurity into the now exposed surface portions of said substrate to form second diffusion regions in said substrate to form junctions between said first and second diffusion regions so as to encircle the ends of the junctions with those portions of said second oxide insulation embedded in said substrate.

7. A process of producing semiconductor devices as claimed in claim 6, wherein said second coating for blocking the charged particles is at least partly disposed on each of said exposed surface portions of said substrate.

8. A process of producing semiconductor devices as claimed in claim 6 wherein each of said first and second coatings for blocking the charged particles is a film of a material selected from the group consisting of a silicon nitride film, a silicon dioxide film, an aluminum oxide film, an aluminum film, a molybdenum film, a tungsten film and mixtures thereof.

9. A process of producing semiconductor devices as claimed in claim 6 wherein said substrate is silicon in the form of a single crystal and wherein said charged particles are ions of an element selected from the group consisting of indium, gallium, antimony, tin and arsenic.

10. A process of producing semiconductor devices comprising the steps of forming a film of oxide insulation on a surface of a substrate of semiconductive material having a first conductivity, selectively removing said film of oxide insulation film from said surface of said substrate to expose selected portions of said surface of said substrate, diffusing an impurity imparting a second conductivity into said exposed portions of said surface of said substrate to form diffusion regions in said substrate, epitaxially growing crystalline semiconductive material so that a layer of semiconductive material in the form of single crystal is grown on each of said diffusion regions while a layer of the polycrystalline semiconductive material is grown on said film of oxide insulation, forming coatings for blocking charged particles on said layers of semiconductive material in the form of the single crystal, irradiating said surface of said substrate with accelerated charged particles to implant said charged particles in said layer of polycrystalline semiconductive material, heating said layer of polycrystalline semiconductive material in which said charged particles have been implanted to convert the semiconductive material of said polycrystalline layer to an oxide insulation.

11. A process of producing semiconductor devices as claimed in claim 10 wherein said coating for blocking the charged particles is a film of a material selected from the group consisting of a silicon nitride film, a silicon dioxide film, an aluminum oxide film, an aluminum film, a molybdenum film, a tungsten film and mixtures thereof.

12. A process of producing semiconductor devices as claimed in claim 10 wherein said substrate is silicon in the form of a single crystal and wherein said charged particles are ions of an element selected from the group consisting of indium, gallium, antimony, tin and arsenic.

* * * * *